(12) United States Patent
Shen et al.

(10) Patent No.: US 9,418,847 B2
(45) Date of Patent: Aug. 16, 2016

(54) LITHOGRAPHY SYSTEM AND METHOD FOR HAZE ELIMINATION

(71) Applicant: Taiwan Semiconductor Manufacturing Company, Ltd., Hsin-Chu (TW)

(72) Inventors: Ching-Wei Shen, Taichung (TW); Kuan-Wen Lin, Taichung (TW); Chi-Lun Lu, Hsinchu (TW); Ting-Hao Hsu, Hsinchu (TW); Sheng-Chi Chin, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 279 days.

(21) Appl. No.: 14/163,287

(22) Filed: Jan. 24, 2014

(65) Prior Publication Data
US 2015/0212419 A1 Jul. 30, 2015

(51) Int. Cl.
| | | |
|---|---|---|
| *G03F 1/62* | (2012.01) | |
| *H01L 21/027* | (2006.01) | |
| *G03F 1/48* | (2012.01) | |
| *G03F 7/20* | (2006.01) | |

(52) U.S. Cl.
CPC .............. *H01L 21/0274* (2013.01); *G03F 1/48* (2013.01); *G03F 1/62* (2013.01); *G03F 7/7095* (2013.01); *G03F 7/70283* (2013.01); *G03F 7/70916* (2013.01)

(58) Field of Classification Search
CPC ................ G03F 1/62; G03F 1/64; G03F 7/20
See application file for complete search history.

(56) References Cited

U.S. PATENT DOCUMENTS

| | | | |
|---|---|---|---|
| 2006/0246234 A1* | 11/2006 | Meyers | ..................... G03F 1/64 428/14 |
| 2006/0263703 A1* | 11/2006 | Zhang | ..................... G03F 1/142 430/5 |
| 2011/0244395 A1 | 10/2011 | Huang et al. | |
| 2012/0308922 A1 | 12/2012 | Lin et al. | |

OTHER PUBLICATIONS

Masaru Kobayashi et al., "Photocatalytic Activity of Titanium Dioxide and Zinc Oxide," Cosmetics & Toiletries Magazine, vol. 112, Jun. 1997, Allured Publishing Corp., U.S. Cosmetics Corp., Dayville, CT, USA, pp. 83-85.

\* cited by examiner

*Primary Examiner* — Stephen Rosasco
(74) *Attorney, Agent, or Firm* — Haynes and Boone, LLP

(57) ABSTRACT

The present disclosure provides an apparatus in semiconductor manufacturing. The apparatus includes a mask, a pellicle frame attached to the mask, and a pellicle joined to the pellicle frame thereby forming a sealed enclosure bounded by the pellicle, the pellicle frame, and the mask. The apparatus further includes photo-catalyst particles introduced into the sealed enclosure before the sealed enclosure is formed. The photo-catalyst particles prevent haze formation within the enclosure during lithography exposure processes.

20 Claims, 5 Drawing Sheets

US 9,418,847 B2

LITHOGRAPHY SYSTEM AND METHOD FOR HAZE ELIMINATION

BACKGROUND

In semiconductor technologies, masks (photomasks or reticles) are formed with predesigned integrated circuit (IC) patterns. The masks are used to transfer those predesigned IC patterns to semiconductor wafers in lithography processes. The masks may sometimes include one or more defects, due to multiple reasons. Any defect on a mask will be transferred to multiple semiconductor wafers and cause yield issues and quality concerns.

One source of mask defects is mask haze which may be introduced during mask making, handling, or lithography processes. For example, chemicals, such as $SO_2$ and/or $NH_3$, may be outgassed during mask making process. Despite some cleaning procedures, these chemicals continue to exist at the surface of the masks during deep ultraviolet (DUV) exposure process. The DUV exposure process generates highly energized photons that facilitate reaction of these chemicals with atmospheric gases to produce ammonium sulfate nano-crystals, causing mask haze. Mask haze may cause printing errors on a wafer, and thus should be eliminated.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
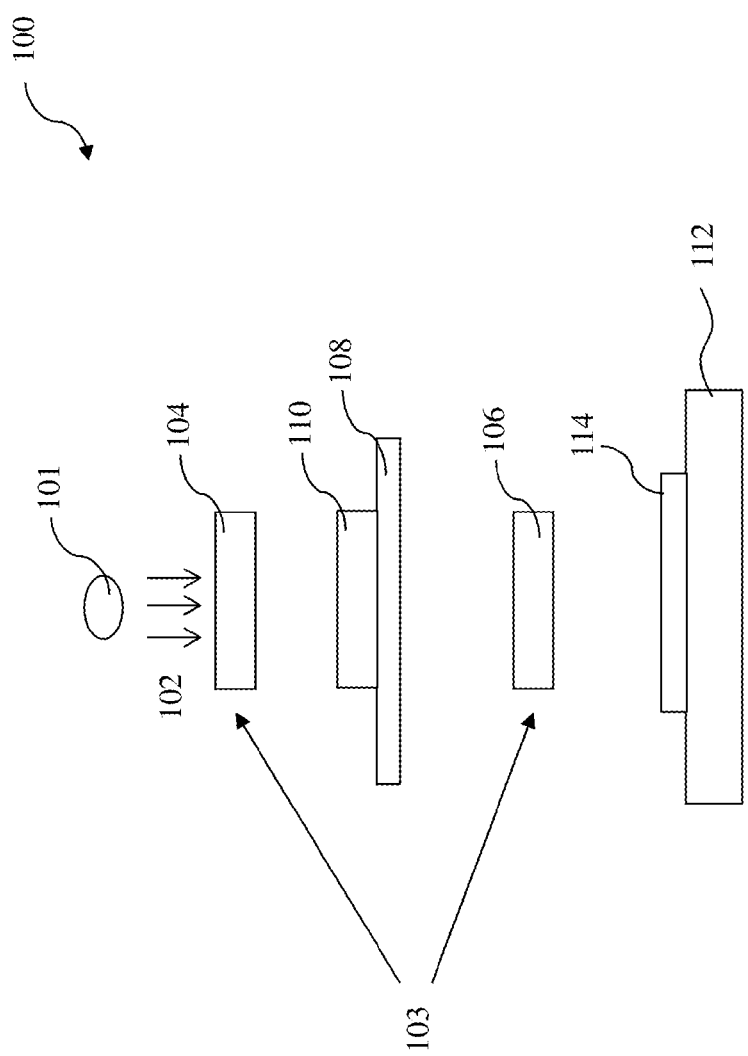
FIG. 1 is a schematic view of a lithography apparatus constructed according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As discussed above, it is desirable to eliminate mask haze. One method of removing haze is by periodically inspecting and cleaning a mask. However, mask cleaning could be expensive. For example, an extra set of masks is thereby needed at the IC manufacturer. Also, mask cleaning solution itself degrades the mask IC patterns. Another method of avoiding mask haze is to use a pellicle to seal a mask, preventing environmental gases outside the pellicle from reacting with contaminants freely on the surface of the mask. However, even with a pellicle, some environmental gases may still enter into the pellicle or may be trapped inside the pellicle. Therefore, haze formation is not completely prevented.

The present disclosure is generally related to preventing haze formation on a mask by using photo-catalyst particles that are sealed, together with IC patterns of the mask, in a pellicle/mask assembly during lithography exposure process.

FIG. 1 illustrates a schematic view of a lithography system (or an exposure apparatus) 100 that may benefit from various aspects of the present disclosure. With reference to FIG. 1, the lithography system 100 and the method to utilize the same are collectively described. The lithography system 100 includes an exposure source (or radiation source) 101, an optical subsystem 103, a mask stage 108 configured and designed to secure a mask assembly 110, and a wafer stage 112 that is designed to secure a wafer 114. The lithography system 100 is designed to perform a lithography exposure process in a suitable mode, such as a step-and-scan mode.

The exposure source 101 provides radiation energy 102. The exposure source 101 may be any suitable light source, such as ultraviolet (UV) light. In various examples, the exposure source 101 may include a light source selected from the group consisting of UV source, deep UV (DUV) source, extreme UV (EUV) source, and X-ray source. For example, the exposure source 101 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source is an EUV source having a wavelength of about 13.5 nm or less.

The optical subsystem 103 receives the radiation energy 102 from the exposure source 101, modulates the radiation energy 102 by the image of the mask assembly 110, and directs the radiation energy 102 to a resist layer coated on the wafer 114. In an embodiment, the optical subsystem 103 is designed to have a refractive mechanism. In this situation, the optical subsystem 103 includes various refractive components, such as lenses. In another embodiment where the radiation energy 102 is EUV energy, the optical subsystem 103 is designed to have a reflective mechanism. In this situation, the optical subsystem 103 includes various reflective components, such as mirrors.

In an embodiment, the optical subsystem 103 includes an illumination unit (e.g., a condenser) 104. The illumination unit 104 may include a single lens or a lens module having multiple lenses and/or other lens components. For example, the illumination unit may include micro-lens arrays, shadow masks, and/or other structures designed to aid in directing radiation energy 102 from the exposure source 101 onto the mask assembly 110.

In an embodiment, the optical subsystem 103 includes a projection unit 106. The projection unit may have a single lens element or a plurality of lens elements configured to provide proper illumination to the resist layer on the wafer 114. The optical subsystem 103 may further include additional components such as an entrance pupil and an exit pupil to form an image of the mask assembly 110 on the wafer 114. In another embodiment, the optical subsystem 103 may alternatively include various mirror components to provide a reflective mechanism of imaging.

In an embodiment, the mask stage 108 is configured and designed to secure the mask assembly 110 by a clamping mechanism, such as vacuum chuck or e-chuck. The mask stage 108 is further designed to be operable to move for various actions, such as scanning. During a lithography exposing process (or exposure process), the mask assembly 110 is secured on the mask stage 108 and positioned such that an integrated circuit pattern defined thereon is imaged on the resist layer coated on the wafer 114. In an embodiment, the mask assembly 110 includes a transparent substrate and an absorption layer that is patterned to have one or more openings through which the radiation energy 102 may travel without being absorbed by the absorption layer.

In another embodiment where the radiation energy 102 is EUV energy, the mask assembly 110 includes a substrate coated with a plurality of films to provide a reflective mechanism. For example, the mask assembly 110 includes tens of alternating layers of silicon and molybdenum deposited on a substrate to act as a Bragg reflector that maximizes the reflection of EUV light. In an embodiment, the mask assembly 110 further includes an absorption layer, such as a tantalum boron nitride film, patterned to define a layout pattern of an integrated circuit.

The wafer stage 112 is designed to secure the wafer 114. The wafer stage 112 is further designed to provide various motions, such as transitional motion and rotational motion. In an embodiment, the wafer 114 includes a semiconductor substrate having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. The wafer 114 is coated with the resist layer that is resistive to etch and/or ion implantation and is sensitive to the radiation energy 102.

The wafer 114 includes a plurality of fields having integrated circuits defined therein for one or more dies. During a lithography exposing process, the wafer 114 is exposed one field at a time. For example, the lithography system 100 scans the IC pattern defined in the mask assembly 110 and transfers it to one field, then steps to next field and repeats the scanning until the fields in the wafer 114 are exhausted. Each field includes one or more circuit dies and a frame region at a boundary area. After the lithography exposure process is applied to the resist layer coated on the wafer 114, the resist layer is further developed by a developing chemical to form a patterned resist layer that have various openings for subsequent semiconductor processing, such as etching or ion implantation.

In an embodiment, the lithography system 100 is designed for immersion lithography. An immersion liquid, such as water, is filled in the space between the projection unit 106 and the wafer stage 112 such that the optical refractive index is increased and the optical resolution of the lithography exposure process is enhanced. In this embodiment, the lithography system 100 may include various components designed and configured to provide, hold and drain the immersion liquid.

During the lithography exposure processes, haze may form on surfaces of the mask assembly 110, which in turn causes printing errors on the wafer 114. Although exact mechanism of haze formation is still under study, it is generally thought that chemical residues from mask making and/or cleaning processes, such as $C_m$—$O_n$—$H_o$, ammonia ($NH_3$) and amines, and/or $SO_4^{2-}$, react with atmospheric gases, such as $H2O$, $C_x$—$H_y$, and $SO_x$, thereby forming haze. Such chemical reaction becomes more serious with the aid of highly energized photons produced with shorter exposure wavelengths of the radiation energy 102. Haze, in forms of nano-scale crystals, may accumulate on the surfaces of the mask assembly 110 during each exposure process. When the haze grows to a certain size, it causes printing errors on the wafer 114 and introduces defects to the IC products, such as circuit shorts, opens, etc.

One way to prevent haze from causing IC defects is to monitor the imaging quality of the mask assembly 110 and to periodically clean the mask assembly 110. The cleaning solution removes the haze contaminants thereby extending the usable life of the mask assembly 110. However, the cleaning solution itself may leave residue on the surfaces of the mask assembly 110. In addition, the cleaning solution also degrades the IC layout patterns on the mask assembly 110. Therefore, only a limited number of cleaning cycles may be performed on the mask assembly 110 before it reaches the end of its usable life.

Another way to ameliorate the haze formation issue is to include a pellicle in the mask assembly 110. For example, the pellicle may be mounted on a pellicle frame which is adhesively attached to a mask having a substrate and a patterned absorption layer. The patterned absorption layer is "sealed" in an enclosure bounded by the substrate, the pellicle frame, and the pellicle. By having a pellicle, contaminants will mostly form on the outside surfaces of the pellicle. Due to different depth of focus (DOF), impurities on the surface of the pellicle do not transfer to the wafer 114. However, the patterned absorption layer is not completely immune from haze formation for at least two reasons. First, chemical residues, such as $NH_3$, are not completely removed from the surfaces of the mask within the enclosure. Second, small holes are commonly drilled into the pellicle frame so that the pressure of the air in the enclosure remains equal to the ambient air pressure. These holes provide paths for atmospheric gases entering into the enclosure.

The present disclosure uses certain photo-catalyst particles in the mask assembly 110 to prevent haze formation thereon.

Figure 2A:
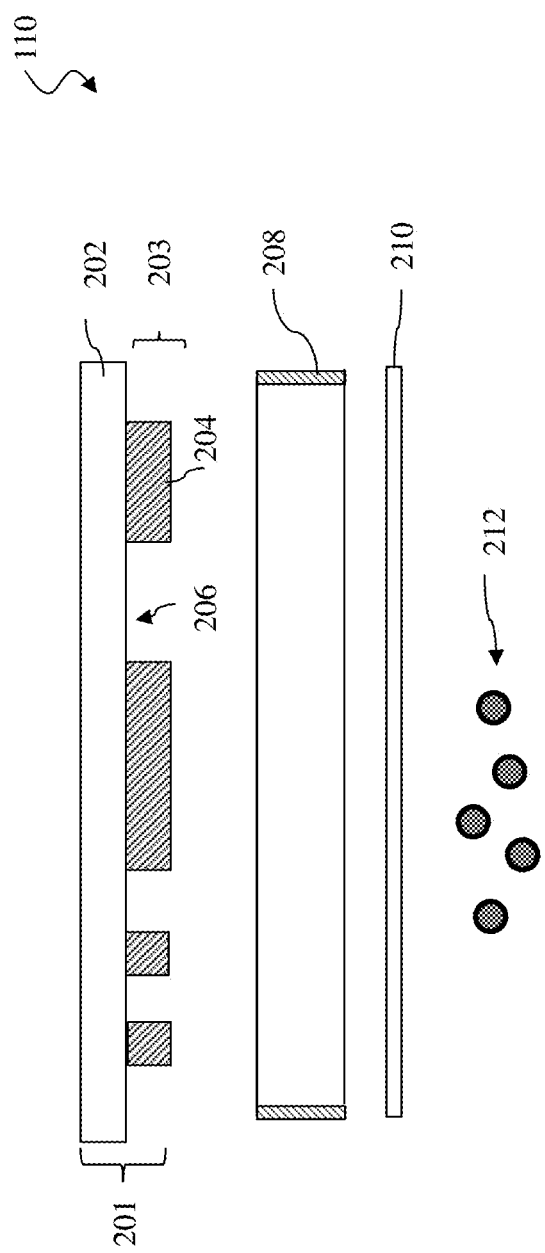
FIGS. 2A and 2B illustrate a mask assembly constructed according to aspects of the present disclosure in one or more embodiments.
Figure 2B:
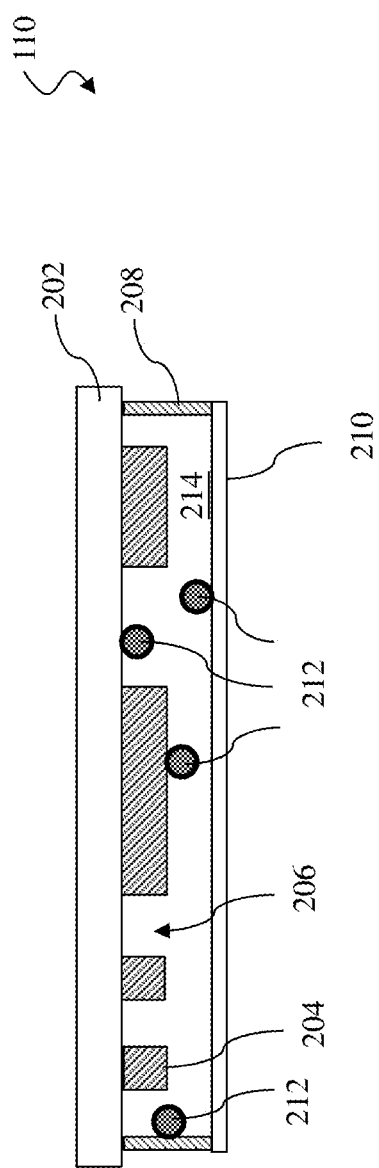

FIGS. 2A and 2B illustrate an embodiment of the mask assembly 110 constructed according to various aspects of the present disclosure. Specifically, FIG. 2A shows various components of the mask assembly 110 before they are assembled and FIG. 2B shows the components assembled to form the mask assembly 110.

Referring to FIG. 2A, the components used to form the mask assembly 110 include a mask 201, a pellicle frame 208, a pellicle 210, and photo-catalyst particles 212. In an embodiment, the mask 201 is a transmissive mask that includes a transparent substrate 202 and a patterned absorption layer 203. The transparent substrate 202 may use fused silica ($SiO_2$) relatively free of defects, such as borosilicate glass and soda-lime glass. The transparent substrate 202 may use calcium fluoride and/or other suitable materials, such as fused quartz, silicon carbide, and silicon oxide-titanium oxide alloy. The patterned absorption layer 203 may be formed using a plurality of processes and a plurality of materials, such as depositing a metal film made with chromium (Cr), MoSi, or MoSiON. The patterned absorption layer 203 includes opaque regions 204 and transparent regions 206. A light beam may be partially or completely blocked when directed on the opaque regions 204. Either the opaque regions 204 or the transparent regions 206 may represent IC design patterns, depending on the type of the resist (e.g. positive resist or negative resist) coated on the wafer 114 (FIG. 1) and the IC patterns (e.g. trenches or lines) to be formed on the wafer 114. The mask 201 may incorporate resolution enhancement techniques such as phase shift mask (PSM) and/or optical proximity correction (OPC).

Figure 3:
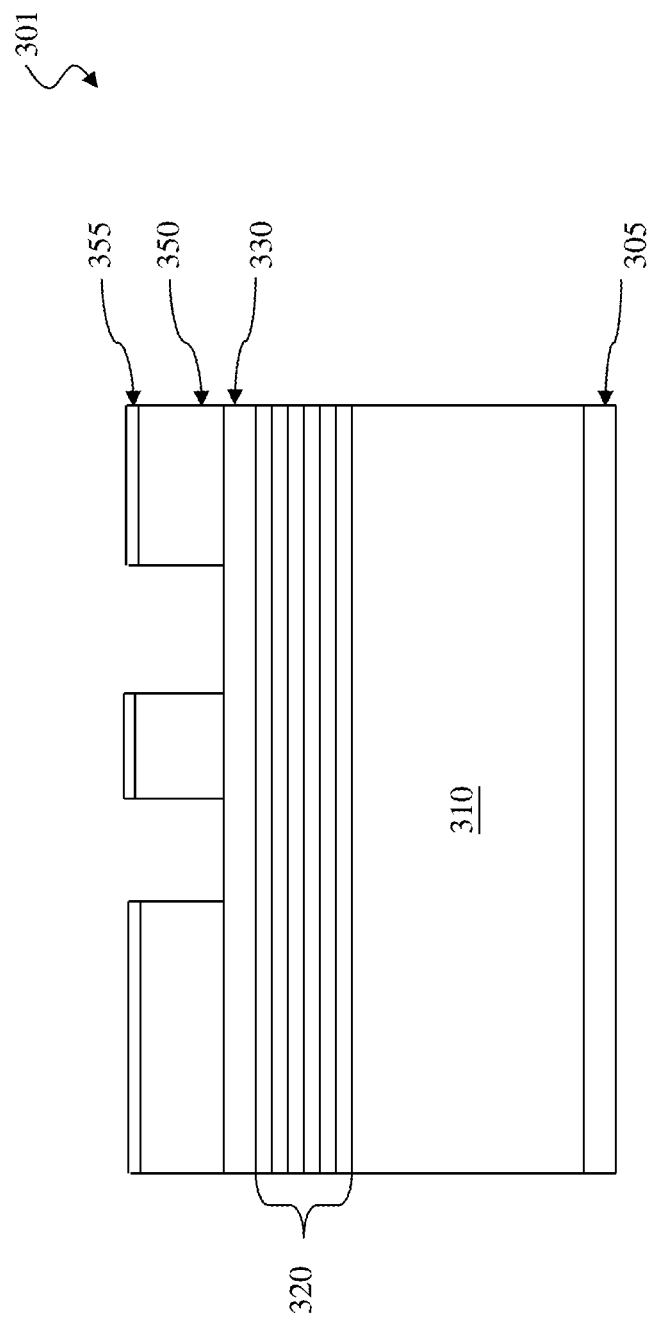
FIG. 3 is an exemplary reflective mask that may be used in the lithography apparatus of FIG. 1, in accordance with an embodiment.

In an embodiment, the mask 201 is a reflective mask, such as one used in EUV lithography. FIG. 3 illustrates a cross sectional view of an EUV mask 301 that includes a substrate 310, a reflective multilayer (ML) 320, a capping layer 330, an absorption layer 350, and a protection layer 355 deposited over the absorption layer 350. In addition, a conductive layer 305 may be deposited under the substrate 310, as shown in FIG. 3, for electrostatic chucking purposes.

The substrate 310 serves to minimize image distortion due to mask heating by intensified EUV radiation. In one or more embodiments, the substrate 310 includes low thermal expansion material (LTEM). The LTEM may include fused silica, fused quartz, calcium fluoride ($CaF_2$), silicon carbide, silicon oxide-titanium oxide alloy and/or other suitable LTEM.

The ML 320 includes a plurality of film pairs, such as molybdenum-silicon (Mo/Si) film pairs (e.g., a layer of molybdenum above or below a layer of silicon in each film pair). Alternatively, the ML 320 may include molybdenum-beryllium (Mo/Be) film pairs, or any two materials or two material combinations with large difference in refractive indices and small extinction coefficients. A typical number of film pairs are 20-80, however any number of film pairs are possible. Depending on the wavelength and an incident angle of the radiation energy 102 (FIG. 1) projected onto the mask 301, the thickness of each layer of the ML 320 may be adjusted to achieve maximal constructive interference for radiations reflected at different interfaces of the ML 320.

The capping layer 330 has different etching characteristics from the absorption layer 350 and acts as an etching stop layer in a patterning or repairing process of the absorption layer 350. In an embodiment, the capping layer 330 includes ruthenium (Ru) or Ru compounds such as ruthenium-boron (RuB) or ruthenium-silicon (RuSi).

The absorption layer 350 absorbs EUV radiation projected thereon. The absorption layer 350 may include a single layer or multiple layers of chromium (Cr), chromium oxide (CrO), titanium nitride (TiN), tantalum nitride (TaN), tantalum (Ta), titanium (Ti), palladium, tantalum boron nitride (TaBN), aluminum oxide (AlO), molybdenum (Mo), or other suitable materials.

The protection layer 355 protects the absorption layer 350 from oxidation when the mask 301 is in a cleaning process. In an embodiment, the protection layer 355 includes tantalum boron oxide (TaBO).

In the following discussion, the mask 201 is a transmissive mask. However, those of ordinary skill in the art should appreciate that the present disclosure can be used with either a transmissive mask or a reflective mask.

Referring back to FIG. 2A, the pellicle frame 208 is to be mounted between the mask 201 and the pellicle 210. The pellicle frame 208 may be a round or a rectangular shape, mounted in a region of the mask 201 surrounding the IC design patterns. The pellicle frame 208 is made of a rigid material, such as aluminum or plastic, with a thickness of about 6 mm to about 11 mm in one or more embodiments. The height of the pellicle frame 208 is designed such that the pellicle 210 will be mounted at a distance from the mask 201 and impurities on the surfaces of the pellicle 210 will be out of focus during lithography exposing processes. In an embodiment, the pellicle frame 208 is attached to the mask 201 using a pressure sensitive adhesive.

The pellicle 210 is a thin transparent film stretched over the pellicle frame 208. The pellicle 210 may use one of the commercially available films, such as "Film 602" or "Film 703" sold by Micro Lithography, Inc. of Sunnyvale, Calif. The pellicle 210 may be made of suitable materials such as "CYTOP" manufactured by Asahi Glass Co., Ltd. of Tokyo, Japan or "FLON AF" resin manufactured by DuPont Kabushiki Kaisha, of Tokyo, Japan. Other materials for the pellicle 210 may include nitrocellulose, fluororesin, plastic resin, synthetic quartz glass, or the like. The pellicle may be from about 2 um thick to about 5 um thick, but these are only examples, and other thicknesses may be used. The pellicle 210 is stretched to remove slack and adhered to the pellicle frame 208 with an adhesive, such as a 1 um film of fluorocarbon resin.

The photo-catalyst particles 212 are made of a semiconductor material that can be excited by the radiation energy 102 (FIG. 1). The photo-catalyst material may include, but not limited to, $TiO_2$, $BaTiO_3$, $ZnO$, $Nb_2O_5$, $SrTiO_3$, $KTaO_3$, $SnO_2$, $Ta_2O_5$, and $ZrO_2$. Each of these materials has a band gap that is less than the photon energy, $h_\gamma$, of the radiation energy 102 used in a 193 nm lithography system 100. For example, $TiO_2$ has a band gap about 3.0 eV to 3.3 eV, while the $h_\gamma$ of 193 nm radiation energy 102 is about 6.3 eV. When the photo-catalyst particles 212 are irradiated by the radiation energy 102 during lithography exposing process, electron holes with positive charges are generated in the valence band of the photo-catalyst particles 212. These electron holes oxidize water ($H_2O_2$) within the mask assembly 110 and produce hydroxyl radicals (—OH). Finally, chemical residues/contaminants, such as $NH_3$, react with the hydroxyl radicals to form chemicals that can be adsorbed by the photo-catalyst particles 212. By removing the chemical residues/contaminants before they form haze, the photo-catalyst particles 212 keep the surfaces of the mask 201 substantially free from haze. The photo-catalyst particles 212 may be washed or replaced periodically to maintain their effectiveness.

FIG. 2B shows that the various components aforementioned are assembled to form the mask assembly 110. Specifically the mask 201, the pellicle frame 208, and the pellicle 210 form a pellicle enclosure 214. The IC design patterns 204/206 and the photo-catalyst particles 212 are sealed within the pellicle enclosure 214. The photo-catalyst particles 212 may be present on a surface of the pellicle 210, a surface of the pellicle frame 208, the opaque regions 204, the transparent regions 206, or a combination thereof. When the mask assembly 110 is irradiated with the radiation energy 102 during lithography exposing processes, the photo-catalyst particles 212 within the pellicle enclosure 214 act as self-cleaning agents to keep the IC design patterns 204/206 substantially free from haze. The particle size of the photo-catalyst particles 212 and the particle concentration level within the pellicle enclosure 214 are designed to maximize the cleaning effect without causing imaging errors by the photo-catalyst particles 212 themselves. In an embodiment where contamination on the surfaces of the pellicle 210 needs to be smaller than 32 nm in order to not form an image on a wafer, the photo-catalyst particles 212 have a particle size in a range from about 5 nm to about 30 nm to avoid becoming a source of imaging errors by themselves. Photo-catalyst particles having a particle size smaller than the above range may also be used. Some exemplary photo-catalyst particles having an average particle size less than 32 nm are: AEROXIDE® "$TiO_2$ P25" and "$TiO_2$ P90" of Evonik Corp. of Parsippany, N.J. which have an average primary particle sizes of 21 nm and approximate 14 nm respectively; VP AEROPERL® "P25/20" of the same firm, which has an average primary particle size of approximate 20 nm; Titanium(IV) oxide "637254" and "718467" (product number) of Sigma-Aldrich of St. Louis, Mo., which have an average particle size of about 25 nm and 21 nm respectively. In another embodiment, the photo-catalyst particles 212 have a particle size distribution wherein the mean particle size plus three times of standard deviation of the particle size is less than about 50 nm to avoid causing wafer printing errors by the photo-catalyst particles 212.

With regard to the concentration level of the photo-catalyst particles 212 in the pellicle enclosure 214, in an embodiment, it is designed to be about 10 times greater than the concentration level of amines, which are derivatives of ammonia ($NH_3$), in the same environment. For example, if the amine concentration level in the lithography system 100 (or the mask assembly 110) is about 3 parts per billion (ppb), the concentration level of the photo-catalyst particles 212 is designed to be about 30 ppb or greater. In an embodiment, the pellicle enclosure 214 has a volume about 11.5×13.7×0.625 $cm^3$; it is estimated to have about 288 amine molecules (based on a 3 ppb concentration level); and it is designed to have about 10,000 to 100,000 photo-catalyst particles 212. This represents a concentration level of the photo-catalyst particles 212 within the pellicle enclosure 214 from about $10^8$ parts/$m^3$ to about $10^9$ parts/$m^3$.

Figure 4:
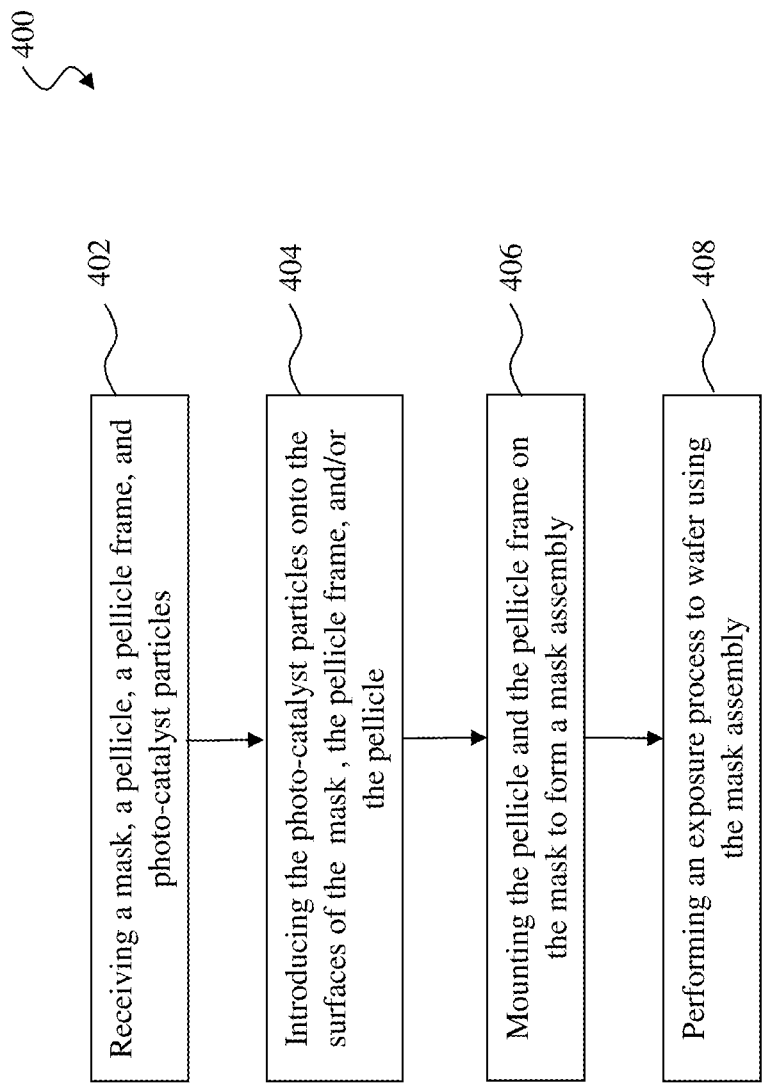
FIG. 4 is a flowchart of a method to be implemented in the lithography apparatus of FIG. 1 in accordance with one or more embodiments.

FIG. 4 shows a method 400 of forming the mask assembly 110 and then using the same in wafer exposure in a lithography system, such as the lithography system 100. At operation 402, the method 400 receives the mask 201, the pellicle 210, the pellicle frame 208, and the photo-catalyst particles 212. At operation 404, the method 400 introduces the photo-catalyst particles 212 onto one or more selected surfaces of the mask 201, the pellicle 210, and the pellicle frame 208. In an embodiment, the photo-catalyst particles 212, such as $TiO_2$, are first mixed with water, and then applied to the surfaces of the mask 201. After the water dries out, the photo-catalyst particles 212 are left on the surfaces of the mask 201. In an embodiment, the photo-catalyst particles 212 are directly sprayed onto the selected surface(s). In yet another embodiment, the mask 201, the pellicle 210, and the pellicle frame 208 are to be assembled in a chamber that is filled with the photo-catalyst particles 212 to a desired concentration level. At operation 406, the method 400 assembles the mask 201, the pellicle 210, and the pellicle frame 208 to form the mask assembly 110, substantially as shown in FIG. 2B. In an embodiment, the operation 406 first mounts the pellicle 210 to the pellicle frame 208 with an adhesive such as a 1 um film of fluorocarbon resin, and then mounts the pellicle/frame assembly to the mask 201 with a pressure sensitive adhesive to thereby seal the photo-catalyst particles 212 within the pellicle enclosure 214. At operation 408, the method 400 uses the mask assembly 110 to expose one or more wafers in a lithography system, such as the lithography system 100 (FIG. 1). During lithography exposing processes, the photo-catalyst particles 212 keep the mask 201 substantially free of haze on the IC design pattern surfaces.

The mask assembly 110 and the method 400 of making the same offer many benefits in mask haze prevention. For example, it is desirable to have as many wafer exposures as possible before the IC design patterns 204/206 of the mask 201 must undergo some cleaning processes. Due to the self-cleaning effect of the photo-catalyst particles 212, the mask assembly 110 maximizes the number of wafer exposures that the mask 201 can provide. For example, the mask assembly 110 forms an environment where the concentration level of the photo-catalyst particles 212 near the IC design patterns 204/206 can be controlled to effectively eliminate chemical residues and contaminants.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to an apparatus in semiconductor manufacturing. The apparatus includes a mask; a pellicle frame attached to the mask; a pellicle joined to the pellicle frame; and photo-catalyst particles, wherein the apparatus provides a sealed enclosure bounded by the pellicle, the pellicle frame, and the mask, and the photo-catalyst particles are enclosed inside the sealed enclosure.

In another exemplary aspect, the present disclosure is directed to a method of forming a mask assembly. The method includes receiving a mask with an integrated circuit (IC) design layout and attaching a pellicle on a pellicle frame to form a first assembly. The method further includes joining the first assembly to the mask in an environment having photo-catalyst particles thereby forming a second assembly, wherein the photo-catalyst particles are filled to a first concentration level in an enclosure bounded by the pellicle, the pellicle frame, and the mask.

In yet another exemplary aspect, the present disclosure is directed to a method of forming a mask assembly. The method includes receiving a mask, a pellicle frame, and a pellicle. The method further includes introducing non-printable photo-catalyst particles to at least a surface of: the mask, the pellicle frame, or the pellicle. The method further includes joining the mask, the pellicle frame, and the pellicle thereby forming a mask assembly having an enclosure bounded by the mask, the pellicle frame, and the pellicle, wherein the enclosure includes the non-printable photo-catalyst particles on at least one of its inside surfaces.

What is claimed is:

1. An apparatus in semiconductor manufacturing, comprising:
   a mask;
   a pellicle frame attached to the mask;
   a pellicle joined to the pellicle frame; and
   photo-catalyst particles,
   wherein the apparatus provides an enclosure defined by the pellicle, the pellicle frame, and the mask, and the photo-catalyst particles are inside the enclosure, on a circuit pattern area of the mask, and configured to remove contaminants from the enclosure.

2. The apparatus of claim 1, wherein the photo-catalyst particles have a particle size distribution whose mean particle size plus three times of standard deviation is less than 50 nanometer (nm).

3. The apparatus of claim 1, wherein the photo-catalyst particles inside the enclosure have a concentration level in a range from $10^8$ parts/m$^3$ to $10^9$ parts/m$^3$.

4. The apparatus of claim 1, wherein the photo-catalyst particles have a crystal form of: a mixture of anatase TiO and rutile TiO2, a mixture of rutile $TiO_2$ and ZnO, ZnO, or a combination thereof.

5. The apparatus of claim 1, wherein the mask is a transmissive mask.

6. The apparatus of claim 1, wherein the photo-catalyst particles are attached onto:
   a surface of the pellicle frame inside the enclosure;
   a surface of the pellicle inside the enclosure; or
   a combination thereof.

7. The apparatus of claim 1, wherein the photo-catalyst particles include: $ZrO_2$, $Ta_2O_5$, $SnO_2$, $KTaO_3$, $SrTiO_3$, $Nb_2O_5$, ZnO, $BaTiO_3$, or $TiO_2$.

8. A method, comprising the steps of:
   receiving a mask having a surface patterned with an integrated circuit (IC) design layout;
   attaching a pellicle on a pellicle frame to form a first assembly; and
   joining the first assembly to the mask in an environment having photo-catalyst particles thereby forming a second assembly, wherein the photo-catalyst particles are filled to a first concentration level in an enclosure defined by the pellicle, the pellicle frame, and the mask, and wherein the photo-catalyst particles are attached to the surface of the mask.

9. The method of claim 8, further comprising the step of:
   exposing wafers with the second assembly.

10. The method of claim 9, wherein the photo-catalyst particles have a particle size that is non-printable during the exposing step.

11. The method of claim 9, wherein the first concentration level is about 10 times greater than an amine concentration level in an ambient where the exposing step is performed.

12. The method of claim 8, wherein the photo-catalyst particles include TiO, $TiO_2$, or ZnO.

13. The method of claim 8, wherein the mask is a reflective mask.

14. A method, comprising:
   receiving a mask, a pellicle frame, and a pellicle;
   introducing non-printable photo-catalyst particles to at least a surface of: the mask, or the pellicle; and
   joining the mask, the pellicle frame, and the pellicle thereby forming a mask assembly having an enclosure defined by the mask, the pellicle frame, and the pellicle, wherein the enclosure includes the non-printable photo-catalyst particles on at least one of its inside surfaces.

15. The method of claim 14, wherein the introducing the non-printable photo-catalyst particles to the surface includes:
   mixing the non-printable photo-catalyst particles with water ($H_2O$) to form a solution;
   applying the solution to the surface; and
   drying out the surface.

16. The method of claim 14, wherein the introducing the non-printable photo-catalyst particles to the surface includes, spraying the non-printable photo-catalyst particles onto the surface.

17. The method of claim 16, wherein the surface is in a mask region having integrated circuit patterns.

18. The method of claim 14, wherein the non-printable photo-catalyst particles have a particle size not greater than 30 nanometer (nm).

19. The method of claim 14, wherein the non-printable photo-catalyst particles inside the enclosure have a concentration level more than $10^8$ parts/m$^3$ but less than $10^9$ parts/m$^3$.

20. The apparatus of claim 1, wherein the photo-catalyst particles are attached onto a patterned absorption layer of the mask.

* * * * *